(12) United States Patent
Klaassen et al.

(10) Patent No.: US 6,606,212 B1
(45) Date of Patent: Aug. 12, 2003

(54) WIDEBAND READOUT OF MAGNETO-RESISTIVE HEADS FOR DATA STORAGE

(75) Inventors: Klaassen Berend Klaassen; Jacobus Cornelis Leonardus Van Peppen, both of San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/271,359

(22) Filed: Mar. 17, 1999

(51) Int. Cl.$^7$ .............................. G11B 5/02; G11B 5/03
(52) U.S. Cl. ............................ 360/67; 360/66
(58) Field of Search ...................... 360/66, 67

(56) References Cited

U.S. PATENT DOCUMENTS

| | | | |
|---|---|---|---|
| 4,039,981 A | 8/1977 | Ohashi et al. | |
| 4,105,943 A | 8/1978 | Krause | 330/290 |
| 4,706,138 A | 11/1987 | Joveet et al. | 360/67 |
| 4,786,993 A | 11/1988 | Jove et al. | 360/67 |
| 5,103,353 A | 4/1992 | Jove et al. | 360/67 |
| 5,122,915 A | 6/1992 | Klein et al. | 360/113 |
| 5,204,789 A | 4/1993 | Jove et al. | 360/67 |
| 5,287,406 A | 2/1994 | Kakuishi | 379/404 |
| 5,309,298 A | * 5/1994 | Klaassen et al. | 360/67 |
| 5,374,861 A | 12/1994 | Kubista | 326/30 |
| 5,666,087 A | * 9/1997 | Gorecki | 330/260 |

FOREIGN PATENT DOCUMENTS

EP 0 004 099 9/1979
EP 0 805 436 11/1997

* cited by examiner

Primary Examiner—Regina Y. Neal
(74) Attorney, Agent, or Firm—Khanh Q. Tran, Esq.; Banner & Witcoff, Ltd.

(57) ABSTRACT

A magnetic recording channel front-end for a magnetic storage system includes a magnetoresistive element, an interconnect and a readback amplifier. The interconnect, which has a characteristic impedance, couples the magnetoresistive element to the readback amplifier. The readback amplifier includes a gain stage and an active termination. The gain stage, which has an associated impedance, has an input that is connected to the interconnect. The active termination is coupled to the input of the gain stage, such that an input impedance of the readback amplifier, which is formed by a combination of the impedance associated with the gain stage and the active termination, is substantially equal to the characteristic impedance of the interconnect. Additionally, the gain stage generates a first noise signal that has a first magnitude appearing at an output of the gain stage. The active termination generates a second noise signal that has a second magnitude that also appears at the output of the gain stage. The second magnitude is significantly less that the first magnitude, thereby the signal-to-noise ratio performance of the magnetic recording channel front-end is not adversely affected. When the gain stage is a current-sensing gain stage, the active termination provides positive feedback from the gain stage to the input of the gain stage. When the gain stage is a voltage-sensing gain stage, the active termination provides negative feedback from the gain stage to the input of the gain stage.

14 Claims, 13 Drawing Sheets

WIDEBAND READOUT OF MAGNETO-RESISTIVE HEADS FOR DATA STORAGE

BACKGROUND OF THE INVENTION

1. Field of the Invention

The present invention relates to the field of data storage devices. More particularly, the present invention relates to a magnetic recording channel front-end having an increased channel bandwidth without a degraded signal-to-noise ratio (SNR) performance.

2. Description of the Related Art

The readback bandwidth of conventional magnetic recording channel front-end depends on the impedance of the components forming the channel front-end, i.e., a magnetoresistive (MR) or giant magnetoresistive (GMR) element, an interconnect and readback electronics (i.e., readback amplifier). Until recently, the front-end readback bandwidth requirements were sufficiently low that the bandwidth provided by conventional front-end techniques presented no problems. Nevertheless, magnetic recording data rates have increased so that the readback bandwidth provided by a conventional channel front-end now limits channel transfer.

One approach for increasing the channel bandwidth is by decreasing the limitations on the so-called extrinsic bandwidth, that is, the bandwidth limitation that is caused extrinsic to the read electronics (not including the bandwidth limitations of the readback amplifier), is to terminate the read interconnect by an impedance that is substantially equal to the characteristic impedance of the interconnect. This, however, destroys the signal-to-noise ratio performance of a channel front-end.

To achieve a better defined interconnect, a microstrip connection between the head and readback amplifier has been proposed to replace a twisted-pair wire connection, which provides an ill-defined interconnection. Such a microstrip connection includes two co-planar flat signal conductors formed on a thin sheet of a non-conductive dielectric carrier material having a ground-plane backing, and becomes a transmission line at high frequencies. The characteristic impedance $Z_0$ of a twisted pair, as is in wide-spread use in magnetic recording, is 75–85 Ohms. The characteristic impedance $Z_0$ of a microstrip interconnect depends on the width of the conductors, the spacing between the conductors, and the thickness and dielectric constant of the carrier material. Practically speaking, the characteristic impedance $Z_0$ of a microstrip interconnect in the range of 35–85 Ohms.

There are four configurations for biasing an MR (GMR) element and for reading out, or reading back, a signal: (1) a current bias with current-sensing readback, (2) a voltage bias with current-sensing readback, (3) a voltage bias with voltage-sensing readback, and (4) a current bias with voltage-sensing readback. Because the frequency characteristics of a channel front-end are not sensitive to the particular biasing technique used, only the frequency characteristics of the readback technique used need be considered.

FIG. 1 shows a schematic diagram of a conventional single-ended input, current-sensing readback amplifier configuration 100. In FIG. 1, an MR element $R_{mr}$ that is located in a head 101 is connected to a current-sensing readback amplifier 102 through an interconnect 103. Interconnect 103 has a characteristic impedance $Z_0=R_0$.

Current-sensing readback amplifier 102 includes an npn input transistor 104 and a load resistor $R_L$. Conductor 103a of interconnect 103 is connected to the emitter of transistor 104. Conductor 103b of interconnect 103 is connected to circuit common, or ground. The base of transistor 104 is connected to a bias voltage $V_{bias}$, and the collector of transistor 104 is connected to a power supply voltage $V^+$ through load resistor $R_L$. The output $v_o$ of readback amplifier 102 appears across load resistor $R_L$.

The input impedance $Z_{in}$ for a current-sensing type of readback amplifier, shown in FIG. 1, is the differential emitter resistance of input transistor 104 and is given by $Z_{in}=r_e=kTqI$, where k is Boltzmann's constant, T is the absolute temperature, q is the charge of an electron, and I is the emitter current of transistor 104. Current I provides the bias current for MR element $R_{mr}$, which is typically 5–12 mA. Thus, the input impedance $Z_{in}$ is typically 2–5Ω at room temperature.

FIG. 2 shows a schematic diagram of a conventional single-ended input, voltage-sensing readback amplifier configuration 200. In FIG. 2, an MR element $R_{mr}$ that is located in a head 201 is connected to a voltage-sensing readback amplifier 202 through an interconnect 203. Interconnect 203 has a characteristic impedance $Z_0=R_0$.

Voltage-sensing readback amplifier 202 includes an npn input transistor 204, an input coupling capacitor 205, current sources 206 and 207, an npn cascode transistor 208, and a load resistor $R_L$. Conductor 203a of interconnect 203 is connected to the base of transistor 204 through coupling capacitor 205. Conductor 203b of interconnect 203 is connected to circuit common, or ground. Current source 206 supplies bias current $I_{bias}$ to MR element $R_{mr}$. Current source 207 supplies current to the base of transistor 204. The emitter of transistor 204 is connected to circuit common, or ground. The collector of transistor 204 is connected to the emitter of cascode transistor 208. Cascode transistor 208 is used for eliminating the Miller capacitance at the input of readback amplifier 202. The collector of transistor 208 is connected to a power supply voltage $V^+$ through load resistor $R_L$. The output $v_o$ of readback amplifier 202 appears across load resistor $R_L$.

The input impedance $Z_{in}$ for a voltage-sensing type of readback amplifier is given by $Z_{in}=\beta r_e$, where $\beta$ is the current gain of transistor 204, and $r_e$ is the emitter resistance of transistor 204. Input impedance $Z_{in}$ is typically 500–1000Ω. Input capacitance 205 is approximately 3 pF and is given by $1/2\pi f_t r_e$, where $f_t$ is the transition frequency of transistor 204, which is typically around 10 GHz.

The differential-input versions of the readback amplifiers of FIGS. 1 and 2 are not shown, but have input impedances that are respectively twice the values described above for the single-ended input readback amplifiers. An MR (GMR) element connected to a readback amplifier through an interconnect that has a characteristic impedance $Z_0$ "sees" an impedance $Z_i$ that is given by $$Z_i = Z_0 \frac{Z_{in} + jZ_0\tan\gamma l}{Z_0 + jZ_{in}\tan\gamma l}, \qquad (1)$$

where $\gamma=\omega/v$, $v$ is the transmission line velocity ($\approx$200 km/s for $\epsilon_r=2.25$) and $l$ is the length of the interconnect, which is typically 5 cm for a 3.5 inch drive.

For a current-sensing readback amplifier configuration, the input impedance $Z_{in}=kT/qI_1<<Z_0$. For $\gamma l<<\pi/2$, $Z_i$ approaches $$Z_{in} + jZ_0\tan\gamma l \simeq r_e + j\omega Z_0 \frac{1}{v}. \qquad (2)$$

Thus, when a current-sensing readback amplifier configuration is used, the interconnect behaves like an inductor $Z_0 1/\nu$ that is in series with readout element $R_{mr}$. The transfer characteristic due to the interconnect is then $$\frac{v_o}{v_i} = \frac{R_L}{R_{mr} + r_e} \frac{1}{1 + j\omega \frac{Z_0}{R_{mr} + r_e} \frac{1}{\nu}}. \quad (3)$$

Equation (3) shows that the channel bandwidth of a current-sensing readback amplifier configuration is restricted by the interconnect, and is further reduced as $Z_0$ or 1 increases, or as $\nu$ decreases.

For a voltage-sensing readback amplifier configuration, $Z_{in} = \beta r_e >> Z_0$. For $\gamma 1 << \pi/2$, $Z_i$ approaches $$\frac{Z_0 Z_{in}}{Z_0 + Z_{in} j \tan \gamma l}. \quad (4)$$

Thus, when a voltage-sensing readback amplifier configuration is used, the interconnect behaves like a capacitor $1/\nu Z_0$ that is in parallel with readout element $R_{mr}$ and the input impedance of the readback amplifier. The transfer characteristic due to the interconnect is then $$\frac{v_o}{v_i} = \frac{A}{1 + j \frac{\tan \gamma l}{Z_0} R_{mr}} \simeq \frac{A}{1 + j\omega \frac{1}{\nu Z_0} R_{mr}}. \quad (5)$$

Equation (5) shows that the channel bandwidth for a voltage-sensing readback amplifier configuration is similarly restricted by the interconnect, and is further reduced for large 1, small $\nu$ and small $Z_0$.

When an interconnect is terminated with the characteristic impedance $Z_0$ of the interconnect at the input to the readback amplifier, there are no bandwidth constraints because the read element merely sees an impedance $Z_0$. Terminating the interconnect in its characteristic impedance $Z_0$ can be done for a current-sensing readback amplifier configuration by inserting a resistor $R_S = Z_0 - Z_{in}$ in series with the input impedance of the readback amplifier. For a voltage-sensing readback amplifier configuration, the interconnect can be terminated by placing a resistor having a value of $Z_{in} Z_0 / (Z_{in} - Z_0) = Z_0 \beta r_e / (\beta r_e - Z_0) \approx Z_0$ in parallel across the input of the readback amplifier. This, however, results in an unacceptable decrease in the signal-to-noise ratio (SNR) performance for the electronics.

For a current-sensing readback amplifier configuration, the SNR performance decreases from $$SNR = \frac{v_i}{\sqrt{4kT\left(r_{bb'} + \frac{1}{2}r_e\right)}} \quad (6)$$

to $$SNR = \frac{v_i}{\sqrt{4kT\left(r_{bb'} + \frac{1}{2}r_e + R_s\right)}}. \quad (7)$$

In Equations (6) and (7), $v_i$ is the readback signal of the MR (GMR) element, and $r_{bb'}$ is the base bulk resistance of the input transistor, which is typically 1–5$\Omega$ for MR readback amplifiers. For typical values of T=300 K, $r_{bb'}$=1$\Omega$, $r_e$=5$\Omega$ and $R_s$=70$\Omega$, the SNR performance for a current-sensing readback amplifier configuration degrades by a factor of 4.6.

For a voltage readback amplifier configuration, the SNR performance decreases from $$SNR = \frac{v_i}{\sqrt{4kT\left(r_{bb'} + \frac{1}{2}r_e\right)}} \quad (8)$$

to $$SNR = \frac{v_i}{\sqrt{4kT\left\{\left(r_{bb'} + \frac{1}{2}r_e\right)\left(\frac{Z_0 + R_{mr}}{Z_0}\right)^2 + \frac{R_{mr}^2}{Z_0}\right\}}}. \quad (9)$$

For typical values of T=300 K, $r_{bb'}$, =1$\Omega$, $R_e$=5$\Omega$, $Z_0$=75$\Omega$ and $R_{mr}$=75$\Omega$, the SNR performance for a voltage-sensing readback amplifier configuration degrades by a factor of 2.6.

What is needed is a way to decrease the bandwidth limitations of a magnetic recording channel front-end that are caused extrinsic to the read electronics without degrading the SNR performance of the channel front-end.

SUMMARY OF THE INVENTION

The present invention provides a way to decrease the bandwidth limitations of a magnetic recording channel front-end that are caused extrinsic to the read electronics without degrading the SNR performance of the channel front-end.

The advantages of the present invention are provided by a magnetic recording channel front-end for a magnetic storage system, such as a disk drive, that includes a magnetoresistive element, an interconnect and a readback amplifier. The interconnect has a characteristic impedance, and couples the magnetoresistive element to the readback amplifier. The readback amplifier includes a gain stage and an active termination. The gain stage has an input with an associated input impedance that is connected to the interconnect. According to the invention, the active termination is coupled to the input of the gain stage, such that the input impedance of the readback amplifier, which is formed by a combination of the impedance associated with the gain stage and the active termination, is substantially equal to the characteristic impedance of the interconnect. Additionally, the gain stage generates a first noise signal that has a first magnitude appearing at an output of the gain stage. The active termination generates a second noise signal that has a second magnitude that also appears at the output of the gain stage. According to the invention, the second magnitude is significantly less that the first magnitude, thereby the signal-to-noise ratio performance of the magnetic recording channel front-end is not adversely affected.

When the gain stage is a current-sensing gain stage, the active termination provides positive feedback from the gain stage to the input of the gain stage. When the gain stage is a voltage-sensing gain stage, the active termination provides negative feedback from the gain stage to the input of the gain stage.

BRIEF DESCRIPTION OF THE DRAWING

The present invention is illustrated by way of example and not limitation in the accompanying figures in which like reference numerals indicate similar elements and in which.

DETAILED DESCRIPTION

The present invention terminates an interconnect of a magnetic recording channel front-end with an active termination that is substantially equal to the characteristic impedance of the interconnect, thereby providing a higher bandwidth for the channel front-end. When properly designed, the active termination does not affect the SNR performance of the channel front-end.

Figure 1:
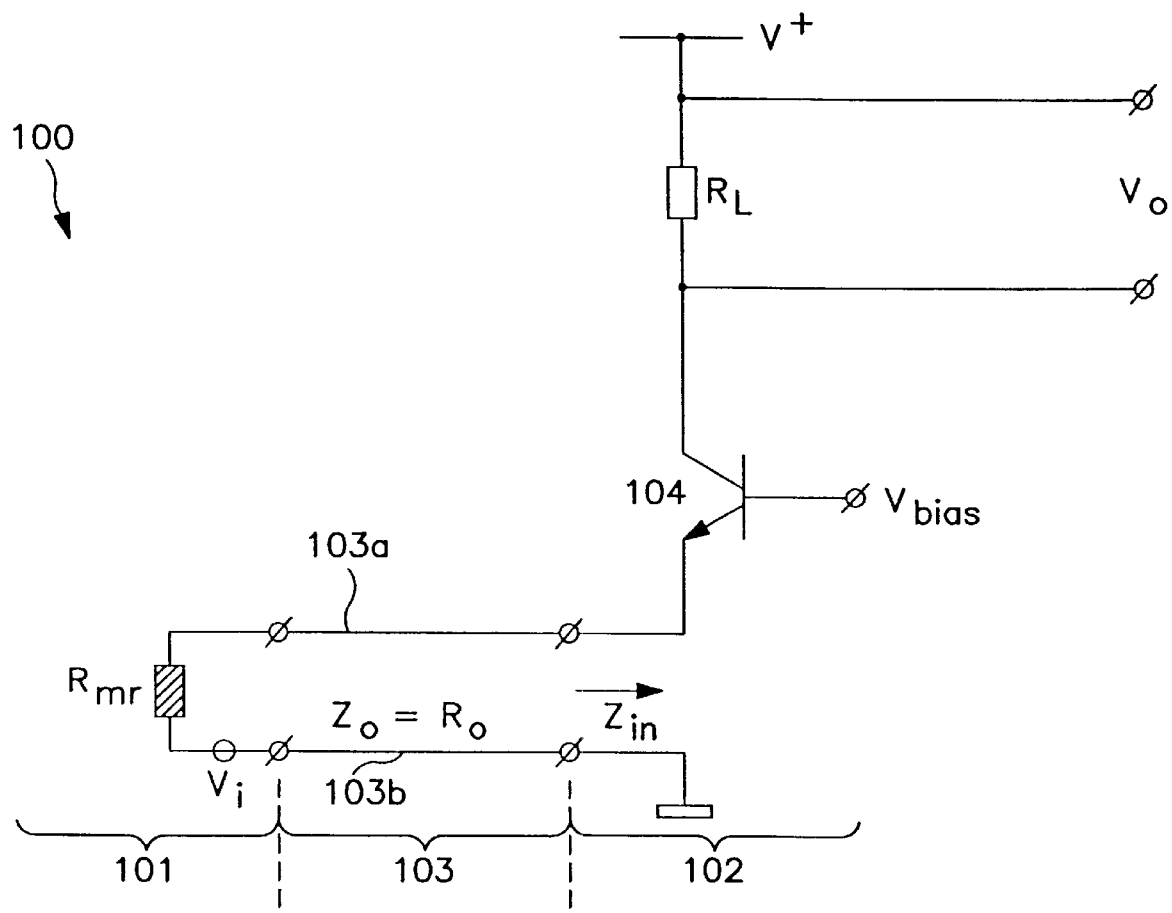
FIG. 1 shows a schematic diagram of a conventional single-ended input, current-sensing readback amplifier configuration.
Figure 2:
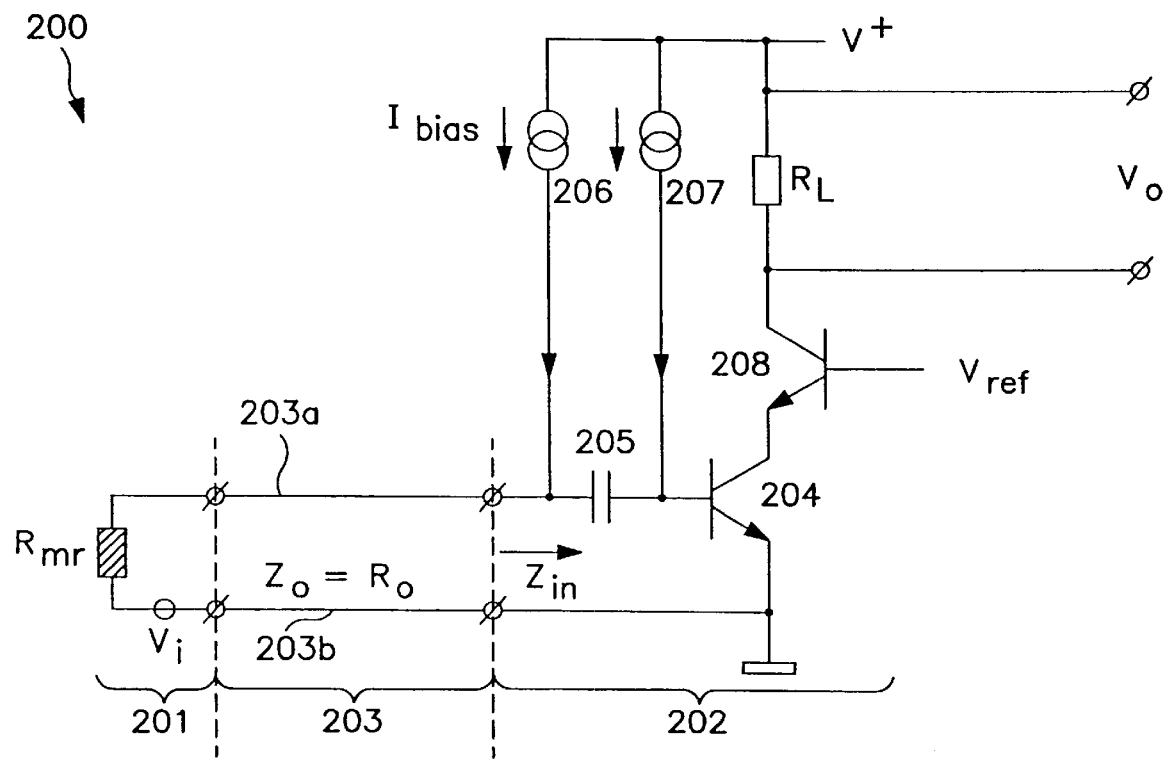
FIG. 2 shows a schematic diagram of a conventional single-ended input, voltage-sensing readback amplifier configuration.
Figure 3:
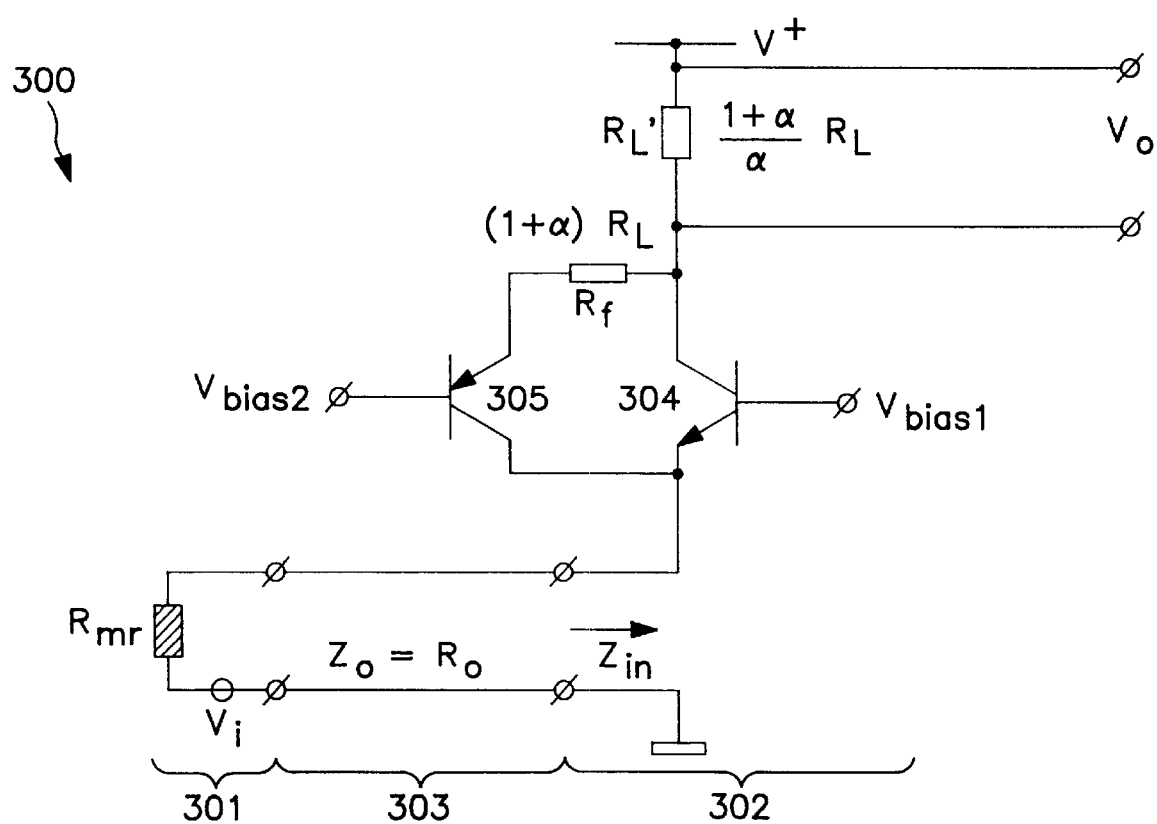
FIG. 3 is a schematic diagram illustrating the present invention for a current-sensing readback amplifier configuration.

FIG. 3 is a schematic diagram illustrating the present invention for a current-sensing readback amplifier configuration 300. In FIG. 3, an MR element $R_{mr}$ that is located in a head 301 is connected to a current-sensing readback amplifier 302 through an interconnect 303. Interconnect 303 has a characteristic impedance $Z_0=R_0$.

Current-sensing readback amplifier 302 includes an npn transistor 304, a pnp transistor 305, a feedback resistor $R_f$ $(=1+\alpha)R_L$) and a load resistor $R'_L$ $(=(1+\alpha)R_L/\alpha)$. Conductor 303a of interconnect 303 is connected to the emitter of transistor 304 and to the collector of transistor 305. Conductor 303b of interconnect 303 is connected to a circuit common, or ground. The bases of transistors 304 and 305 are respectively connected to bias voltages $V_{bias1}$ and $V_{bias2}$. Feedback resistor $R_f$ is connected between the collector of transistor 304 and the emitter of transistor 305. The collector of transistor 304 is also connected to a power supply voltage $V^+$ through load resistor $R'_L$. The output $v_o$ of readback amplifier 302 appears across load resistor $R'_L$.

According to the present invention, the input impedance $Z_{in}$ of readback amplifier 302 is increased to the level of $Z_0 \cong R_0$ by positive feedback. Specifically, input impedance $Z_{in}$ is given by $$Z_{in}=r_{e1}(1+1/\alpha), \qquad (10)$$

where $r_{e1}$ is the emitter differential resistance of transistor 304. By choosing $\alpha \cong r_{e1}/(Z_0-r_{e1})$, interconnect 303 is substantially characteristically terminated, thereby substantially eliminating the high-frequency roll-off associated with interconnect 303. When $\alpha=R_{e1}/(Z_0-r_{e1})$, interconnect 303 becomes characteristically terminated and the high-frequency roll-off associated with interconnect 303 is eliminated altogether. The gain A, or transfer characteristic, of the channel is given by $$A = \frac{v_0}{v_i} = \frac{R_L}{r_{el} + R_{mr}\frac{\alpha}{1+\alpha}}. \qquad (11)$$

When $\alpha \ll 1$, the gain A approaches $R_L/r_{e1}$. The signal-to-noise ratio is given by $$SNR = \frac{v_i}{\sqrt{4kT\left\{\left(r_{bb'1} + \frac{1}{2}r_{el} + r_{bb'2}\right)\left(\frac{r_{el}}{R_L(1+\alpha)}\right)^2 + \frac{r_{el}^2}{R_L(1+\alpha)}\right\}}}. \qquad (12)$$

The first two terms within the brackets in the denominator of Eq. (12) are the contributions to noise generated by transistor 304. The third term is the contribution to noise generated by transistor 305, and the last term is the contribution to noise generated by feedback resistor $R_f=(1+\alpha)R_L$. The last two terms of Eq. (12) are significantly smaller than the first two and, as a result, the signal-to-noise ratio becomes $$SNR \simeq \frac{v_i}{\sqrt{4kT\left(r_{bb'} + \frac{1}{2}r_{el}\right)}}, \qquad (13)$$

which is exactly the same expression as the SNR for a conventional current readback amplifier, as given by Eq. (6). Thus, electronically increasing the input impedance of the readback amplifier to match the characteristic impedance of interconnect 303 does not change the SNR performance of the channel. This is in contrast to passively terminating interconnect 303 in characteristic impedance $Z_0$ by inserting a series resistor $R_s=R_0-r_{e1}$ between interconnect 303 and the input to readback amplifier 302.

In order to obtain a wider interconnect bandwidth, the input impedance $Z_{in}$ is not required to be increased to be exactly $Z_0=R_0$. A lower value of input impedance provides a sufficiently wide extrinsic interconnect bandwidth so that the total bandwidth of the channel front-end will be determined predominately by the bandwidth of the electronics.

Figure 4:
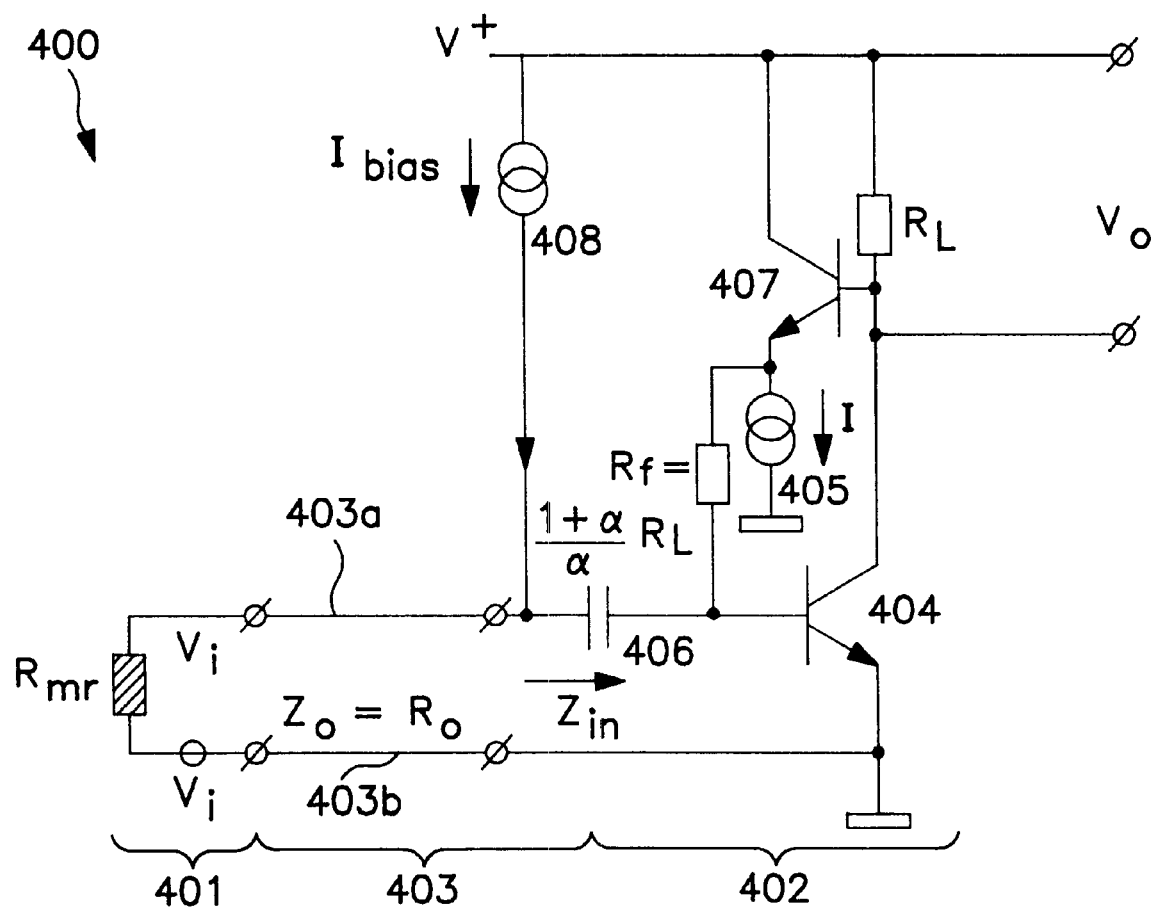
FIG. 4 is a schematic diagram illustrating the present invention for a voltage-sensing readback amplifier configuration.

FIG. 4 is a schematic diagram illustrating the present invention for a voltage-sensing readback amplifier configuration 400. In FIG. 4, an MR element $R_{mr}$ that is located in a head 401 is connected to a voltage-sensing readback amplifier 402 through an interconnect 403. Interconnect 403 has a characteristic impedance $Z_0=R_0$.

Voltage-sensing readback amplifier 402 includes an npn transistor 404, a current source 405, an input coupling capacitor 406, a feedback resistor $R_f$, an npn transistor 407, a current source 408 and a load resistor $R_L$. Conductor 403a of interconnect 403 is connected to the base of transistor 404 through coupling capacitor 406. Conductor 403b of interconnect 403 is connected to a circuit common, or ground. Current source 408 is connected to interconnect 403 and provides a bias current $I_{bias}$ for MR element $R_{mr}$. The collector of transistor 404 is connected to the base of transistor 407 and to a power supply voltage $V^+$ through load resistor $R_L$. The collector of transistor 407 is connected to power supply voltage $V^+$. The emitter of transistor 407 is connected to the base of transistor 404 through feedback resistor $R_f$. The emitter of transistor 407 is also connected to current source 405, which, in turn, is connected to circuit common, or ground. The output $v_o$ of readback amplifier 402 appears across load resistor $R_L$.

The input impedance $Z_{in}$ of readback amplifier 402 is reduced to the level of $Z_{in} \cong R_0$ by negative feedback. Specifically, $$Z_{in} = r_{e1}\left(1 + \frac{1}{\alpha}\right), \quad (14)$$

where $r_{e1}$ is the emitter differential resistance of transistor 404. By choosing $\alpha \cong r_{e1}/(Z_0-r_{e1})$, interconnect 403 is substantially characteristically terminated, thereby providing a high-frequency roll-off for interconnect 403 at a much higher frequency than when interconnect 403 is not terminated according to the present invention. When $\alpha=r_{e1}/(Z_0-r_{e1})$, interconnect 403 becomes characteristically terminated, thereby eliminating the high-frequency roll-off associated with interconnect 403 altogether.

The gain A of readback amplifier 402 (with $R_L/r_{e1} >> 1$) is given by $$A = \frac{v_0}{v_i} = \frac{R_L}{r_{e1} + R_{mr}\frac{\alpha}{1+\alpha}}. \quad (15)$$

When $\alpha << 1$, gain A approaches $R_L/r_{e1}$. So, when $\alpha=r_{e1}/(R_0-r_{e1})$, $$R_f = \frac{1+\alpha}{\alpha}R_L = \frac{R_0 R_L}{r_{e1}} = R_0 A \quad (16)$$

The signal-to-noise ratio is given by $$SNR = \frac{v_i}{\sqrt{4kT\left\{r_{bb'1} + \frac{1}{2}r_{e1} + r_{bb'2}\left(\frac{\alpha R_{mr}}{R_L(1+\alpha)}\right)^2 + \frac{\alpha R_{mr}^2}{R_L(+\alpha)}\right\}}}. \quad (17)$$

The first two terms within the brackets in the denominator of Eq. (17) are the contributions to noise generated by transistor 404. The third term is the contribution to noise generated by transistor 407. The last term is contribution to noise generated by feedback resistor $R_f=(1+\alpha)R_L/\alpha$. The last two terms are significantly smaller than the first two terms and, as a result, the signal-to-noise ratio becomes $$SNR \cong \frac{v_i}{\sqrt{4kT\left(r_{bb'} + \frac{1}{2}r_{e1}\right)}}, \quad (18)$$

which is exactly the same expression as the SNR for a prior-art voltage readback amplifier as given by Eq. (8).

Electronically decreasing the input impedance $Z_{in}$ of a voltage-sensing readback amplifier to match the characteristic impedance of interconnect 403 according to the present invention does not change the SNR performance. This is in contrast to passively terminating interconnect 403 in characteristic impedance $Z_0$ by inserting a parallel resistor $R_P \cong R_0$ across the input of readback amplifier 402. As with the current-sensing readback amplifier configuration of the present invention (FIG. 3), in order to obtain a wider interconnect bandwidth, the input impedance $Z_{in}$ of the voltage-sensing readback amplifier is not required to be reduced to $Z_{in}=Z_0$. A value of input impedance for the voltage-sensing readback amplifier that is greater than the characteristic impedance $Z_0$ provides a sufficiently wide extrinsic interconnect bandwidth that the total bandwidth is determined predominately by the bandwidth of the electronics.

Figure 5:
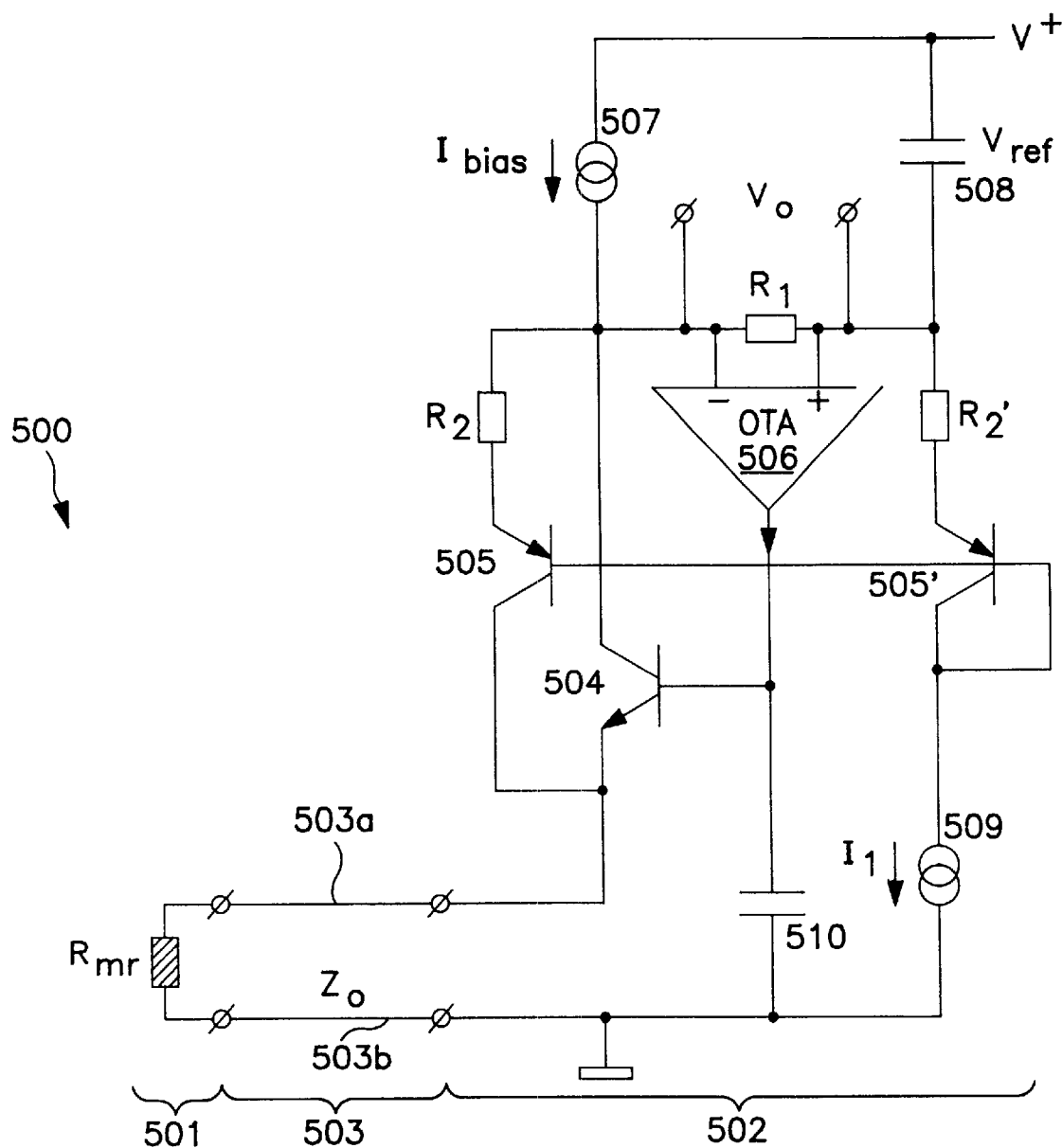
FIG. 5 shows a schematic diagram of an embodiment of a current-biased, current-sensing readback amplifier according to the present invention.

FIG. 5 shows a schematic diagram of an embodiment 500 of a current-biased current-sensing readback amplifier according to the present invention. In FIG. 5, an MR element $R_{mr}$ that is located in a head 501 is connected to a current-sensing readback amplifier 502 through an interconnect 503. Interconnect 503 has a characteristic impedance $Z_0=R_0$.

Current-sensing readback amplifier 502 includes an npn input transistor 504, pnp transistors 505 and 505', feedback resistors $R_2$ and $R'_2$, an operational transconductance amplifier (OTA) 506, a resistor $R_1$, a current source 507, a voltage reference source 508, a current source 509 and a capacitor 510. Conductor 503a of interconnect 503 is connected to the emitter of transistor 504. Conductor 503b of interconnect 503 is connected to a circuit common, or ground. The emitter of transistor 504 is connected to the collector of transistor 505. The emitter of transistor 505 is connected to the collector of transistor 504 through feedback resistor $R_2$. The collector of transistor 504 is connected to a power supply voltage $V^+$ through current source 507, which supplies a current $I_{bias}$.

Current source 509 is connected to the collector of transistor 505'. The bases of transistors 505 and 505' are connected together and to the collector of transistor 505'. The emitter of transistor 505' is connected to power supply voltage $V^+$ through resistor $R'_2$ and voltage reference $V_{ref}$. Current source 509 sinks current $I_1$ from the collector of transistor 505'.

The inverting input of OTA 506 is connected to the collector of transistor 504. The non-inverting input of OTA 506 is connected to the junction of voltage reference $V_{ref}$ and resistor $R'_2$. Resistor $R_1$ is connected between the two inputs of OTA 506. The output of OTA 506 is connected to the base of transistor 504. The output $v_o$ of readback amplifier 502 appears across resistor $R_1$.

The operation of current-sensing readback amplifier 502 is as follows: The current through MR element $R_{mr}$ is equal to $I_{bias}$, the current output from current source 507. By choosing $R_2=R'_2$ and transistor 505 equal to transistor 505', a low-frequency feedback path formed by OTA 506 and capacitor 510 controls the current through transistor 505 to be equal to the current $I_1$ of current source 509. The current through transistor 504 is then $I_{bias}-I_1$, resulting in an emitter differential resistance for input transistor 504 of $r_{e1}=kT/q$ $(I_{bias}-I_1)$. Emitter resistance $r_{e1}$ is a constant, and is determined only by current sources 507 and 509. The low-frequency feedback path also controls the voltage across resistor $R_1$ to be 0 Volts. The input impedance $Z_{in}$ of readback amplifier 502 is increased to the level of $Z_{in} \cong R_0$ by positive feedback provided by feedback resistor $R_2$ and transistor 505.

According to Eq. (10), a should be chosen to be $\alpha \cong r_{e1}/R_0-r_{e1}$), where $\alpha$ is the resistor ratio $R_2/R_1$ (FIG. 3). Under such conditions, the input impedance $Z_{in}$ of readback amplifier 502 is substantially equal to the characteristic impedance $Z_0$ of interconnect 503.

Figure 6:
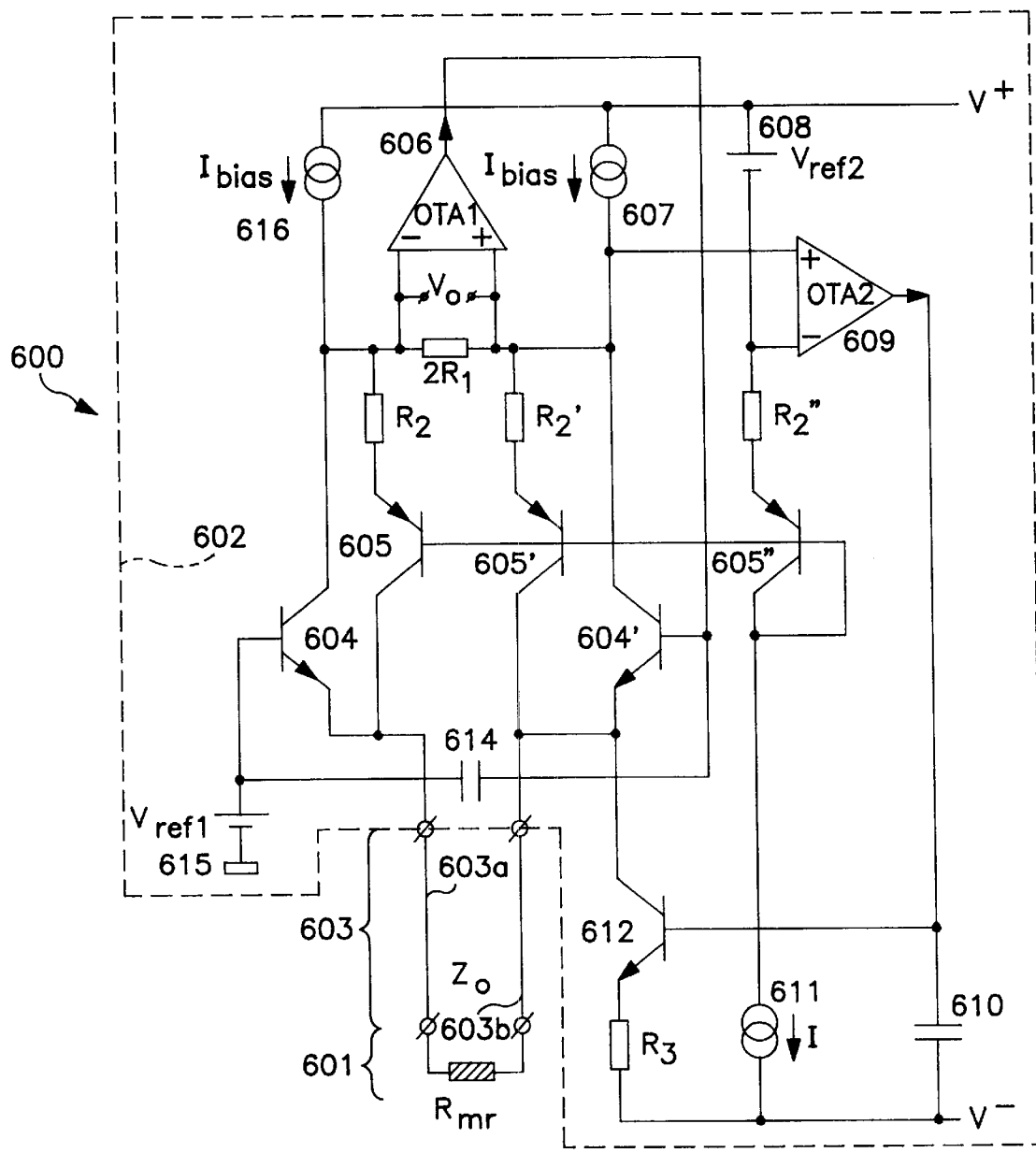
FIG. 6 shows a schematic diagram of an embodiment of a differential current-biased, current-sensing readback amplifier according to the present invention.

FIG. 6 shows a schematic diagram of an embodiment 600 of a differential current-biased, current-sensing readback amplifier according to the present invention. Embodiment 600 is a current-biased, current-sensing readback amplifier like embodiment 500 of FIG. 5, but embodiment 500 is shown in a differential input configuration. In FIG. 6, an MR element $R_{mr}$ that is located in a head 601 is connected to a current-sensing readback amplifier 602 through an interconnect 603. Interconnect 603 has a characteristic impedance $Z_0=R_0$.

Current-sensing readback amplifier 602 includes input npn transistors 604 and 604', transistors 605 and 605', feedback resistors $R_2$ and $R'_2$, an OTA 606, a current source 607, reference voltage sources 608 and 615, and an OTA 609. Conductor 603a of interconnect 603 is connected to the emitter of transistor 604. Conductor 603b of interconnect 603 is connected to the emitter of transistor 604'. The collectors of transistors 605 and 605' are respectively connected to the emitters of transistors 604 and 604'. The emitters of transistors 605 and 605' are respectively connected to the collectors of transistors 604 and 604' through resistors $R_2$ and $R'_2$. The collectors of transistors 604 and 604' are respectively connected to the inverting and non-inverting inputs of OTA 606. Resistor $2R_1$ is connected across the inputs of OTA 606. The output $v_o$ of readback amplifier 602 appears across resistor $2R_1$.

Current sources 616 and 607 respectively supply a current $I_{bias}$ to the collectors of transistors 604 and 604' from a power supply voltage $V^{30}$. The output of OTA 606 is connected to the base of transistor 604' and to the base of transistor 604 through capacitor 614. A reference voltage source 615, which generates a reference voltage $V_{ref1}$, is connected to the base of transistor 604.

The collector of an npn transistor 612 is connected to the emitter of transistor 604'. The emitter of transistor 612 is connected to a power supply voltage $V^-$ through a resistor $R_3$. The base of a pnp transistor 605" is connected to the collector of transistor 605" and to the bases of transistors 605 and 605'. A current source 611 is connected between the collector of transistor 605" and power supply voltage $V^-$. The emitter of transistor 605" is connected to power supply voltage $V^+$ through a resistor $R''_2$ and a reference voltage source 608 that generates reference voltage $V_{ref2}$.

The operation of readback amplifier 602 is similar to that of readback amplifier 502, except that for correctly biasing MR element $R_{mr}$ and readback amplifier 602, a low-frequency feedback path formed by OTA 609, capacitor 610, and a controlled current source (transistor 612 and resistor $R_3$) is added for controlling the voltage on the collectors of transistors 604 and 604' to be $V^+ - V_{ref2}$.

Figure 7:
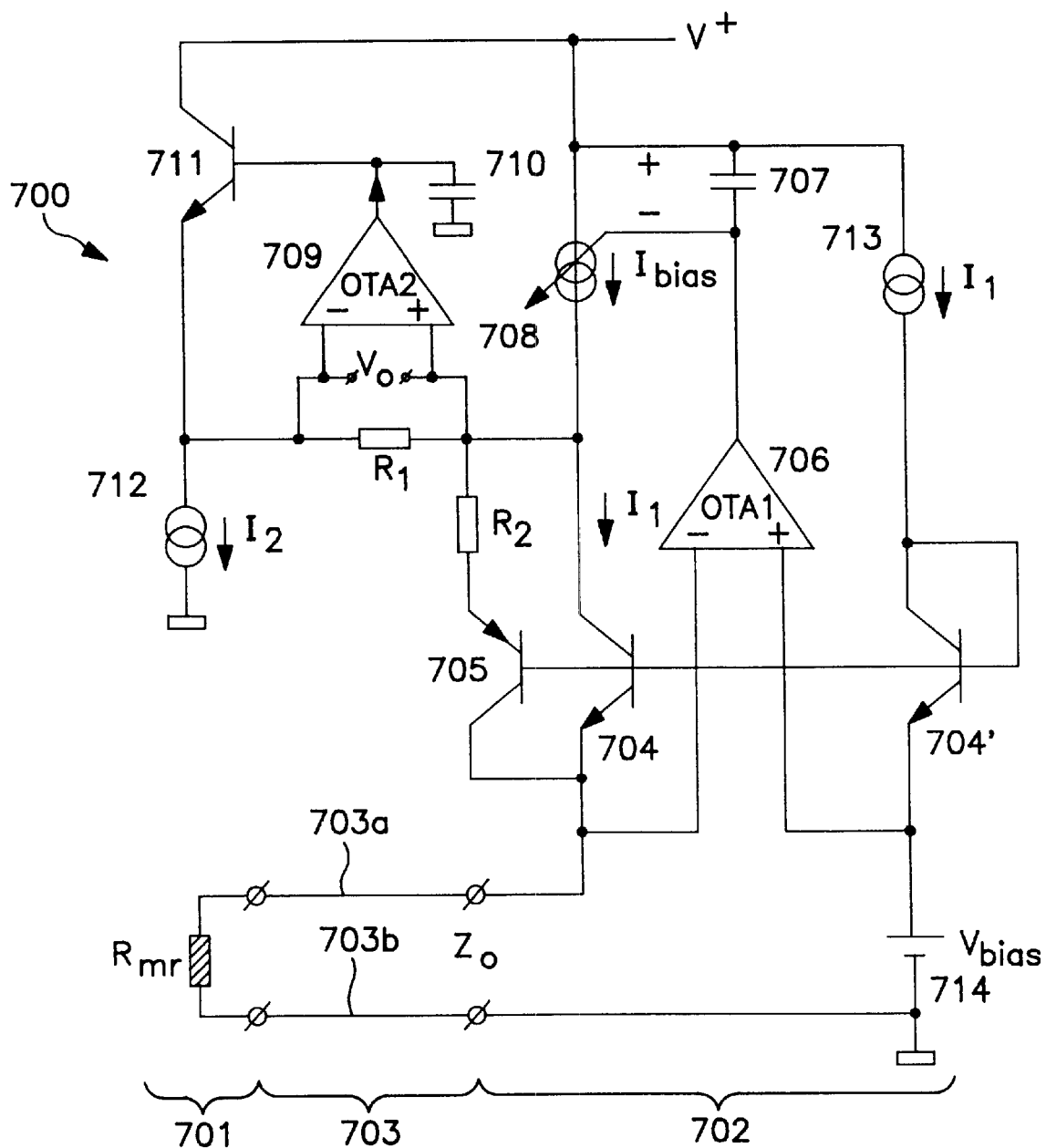
FIG. 7 shows a schematic diagram of an embodiment of a voltage-biased, current-sensing readback amplifier according to the present invention.

FIG. 7 shows a schematic diagram of an embodiment 700 of a voltage-biased, current-sensing readback amplifier according to the present invention. In FIG. 7, an MR element $R_{mr}$ that is located on a head 701 is connected to a current-sensing readback amplifier 702 through an interconnect 703. Interconnect 703 has a characteristic impedance $Z_0 = R_0$.

Current-sensing readback amplifier 702 includes an input npn transistor 704, a pnp transistor 705, an OTA 706, a current source 708, an OTA 709, a resistor $R_1$ and a feedback resistor $R_2$. Conductor 703a of interconnect 703 is connected to the emitter of transistor 704. Conductor 703b of interconnect 703 is connected to a circuit common, or ground. The emitter of transistor 704 is also connected to the collector of transistor 705. The collector of transistor 704 is connected to the emitter of transistor 705 through feedback resistor $R_2$, and to a power supply voltage $V^+$ through current source 708, which supplies a current $I_{bias}$.

The non-inverting input of OTA 706 is connected to the emitter of input transistor 704. The inverting input of OTA 706 is connected to a reference voltage osource 714. The output of OTA 706 controls current source 708. A capacitor 707 is coupled between the output of OTA 706 and power supply voltage $V^+$. A current source 713 is coupled to power supply voltage $V^+$ and supplies a current $I_1$ to the collector of a transistor 704'. The collector of transistor 704' is connected to the bases of transistors 704', 704 and 705.

The non-inverting input of OTA 709 is connected to the collector of transistor 704. The inverting input of OTA 709 is connected to the emitter of a transistor 711 and to a current source 712 that sinks a current $I_2$. Resistor $R_1$ is connected between the non-inverting and the inverting inputs of OTA 709. The output of OTA 709 is connected to capacitor 710 and to the base of transistor 711. The collector of transistor 711 is connected to power supply voltage $V^+$. The output $v_o$ of readback amplifier 702 appears across resistor $R_1$.

The input impedance of readback amplifier 702 is increased to the level of $Z_o \cong R_0$ by positive feedback. The current through the MR element $R_{mr}$ depends on $R_{mr}$, that is, the voltage across MR element $R_{mr}$ is kept constant and equal to $V_{bias}$. The current through input transistor 704 is kept constant and equal to $I_1$ by a low-frequency feedback path formed by OTA 706, a capacitor 707 and a controlled current source 708 that provides bias current $I_{bias}$. Changes in bias current $I_{bias}$ caused by different MR resistances are fully compensated for by a positive feedback path formed by resistor $R_2$ and transistor 705. The input emitter differential resistance of transistor 704 is given by $r_{e1} = kT/qI_1$. As before, $\alpha$ should be chosen to be $\alpha \cong r_{e1}/(R_0 - r_{e1})$, where the resistor ratio $R_2/R_1 = \alpha$(FIG. 3), to make the input impedance $Z_{in}$ of readback amplifier 702 substantially equal to the characteristic impedance $Z_0$ of interconnect 703.

Figure 8:
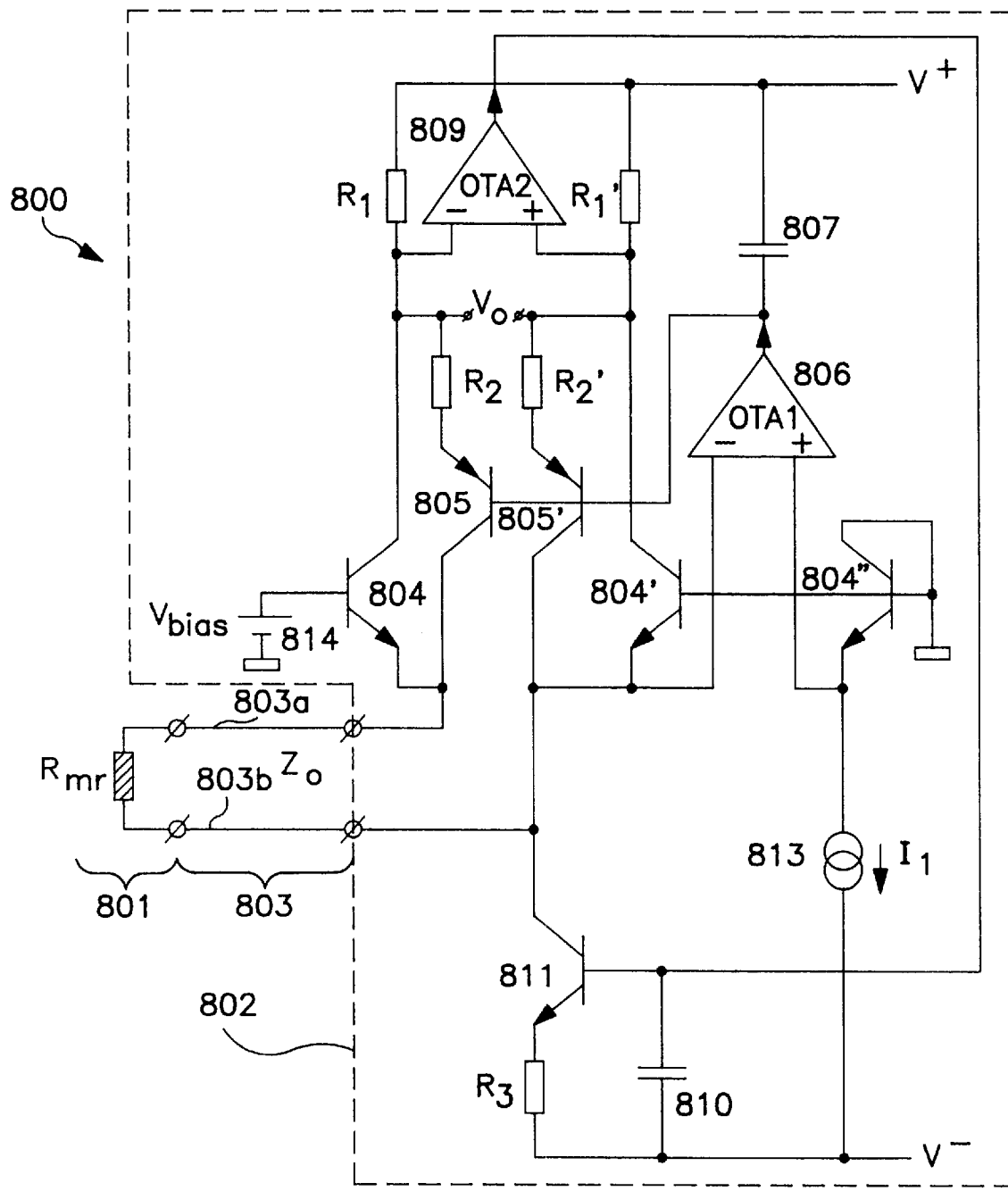
FIG. 8 shows a schematic diagram of an embodiment of a differential voltage-biased, current-sensing readback amplifier according to the present invention.

FIG. 8 shows a schematic diagram of an embodiment 800 of a differential voltage-biased, current-sensing readback amplifier according to the present invention. Embodiment 800 is similar to embodiment 700 shown in FIG. 7, but embodiment 800 is shown in the configuration of a differential voltage-biased, current-sensing readback amplifier. In FIG. 8, an MR element $R_{mr}$ that is located in a head 801 is connected to a current-sensing readback amplifier 802 through an interconnect 803. Interconnect 803 has a characteristic impedance $Z_0 = R_0$.

Current-sensing readback amplifier 802 includes input transistors 804 and 804', transistors 805 and 805', OTA 806, OTA 809, resistors $R_1$ and $R'_1$, and feedback resistors $R_2$ and $R'_2$. Conductor 803a of interconnect 803 is connected to the emitter of transistor 804. Conductor 803b of interconnect 803 is connected to the emitter of transistor 804'. The collectors of transistors 805 and 805' are respectively connected to the emitters of transistors 804 and 804'. The emitters of transistors 805 and 805' are respectively connected to the collectors of transistors 804 and 804' through resistors $R_2$ and $R'_2$. The collectors of transistors 804 and 804' are respectively connected to the inverting and non-inverting inputs of OTA 809. Resistor $R_1$ is connected between the inverting input of OTA 809 and a power supply voltage $V^+$. Similarly, resistor $R'_1$ is connected between the non-inverting input of OTA 809 and power supply voltage $V^+$. The output of OTA 809 is connected to the base of an npn transistor 811 and to a power supply voltage $V^-$ through a capacitor 810. The collector of transistor 811 is connected to the emitter of transistor 804'. The emitter of transistor 811 is connected to power supply voltage $V^-$ through resistor $R_3$.

The non-inverting input of OTA 806 is connected to the emitter of input transistor 804'. The inverting input of OTA 806 is connected to the emitter of a transistor 804" and to a current source 813 that sinks current $I_1$. The output of OTA 806 is connected to the bases of transistors 805 and 805'. A capacitor 807 is coupled between the output of OTA 806 and power supply voltage $V^+$.

The operation of readback amplifier 802 is similar to that of readback amplifier 702 (FIG. 7), except that for the correct biasing of MR element $R_{mr}$ and readback amplifier 802, a low-frequency feedback path formed by an OTA 809, a capacitor 810, and a controlled current source (transistor 811 and resistor $R_3$) is added for controlling the DC voltage between the collectors of 804 and 804' to be 0 Volts. Thus, the currents through each respective half of the input stage are equal.

Figure 9:
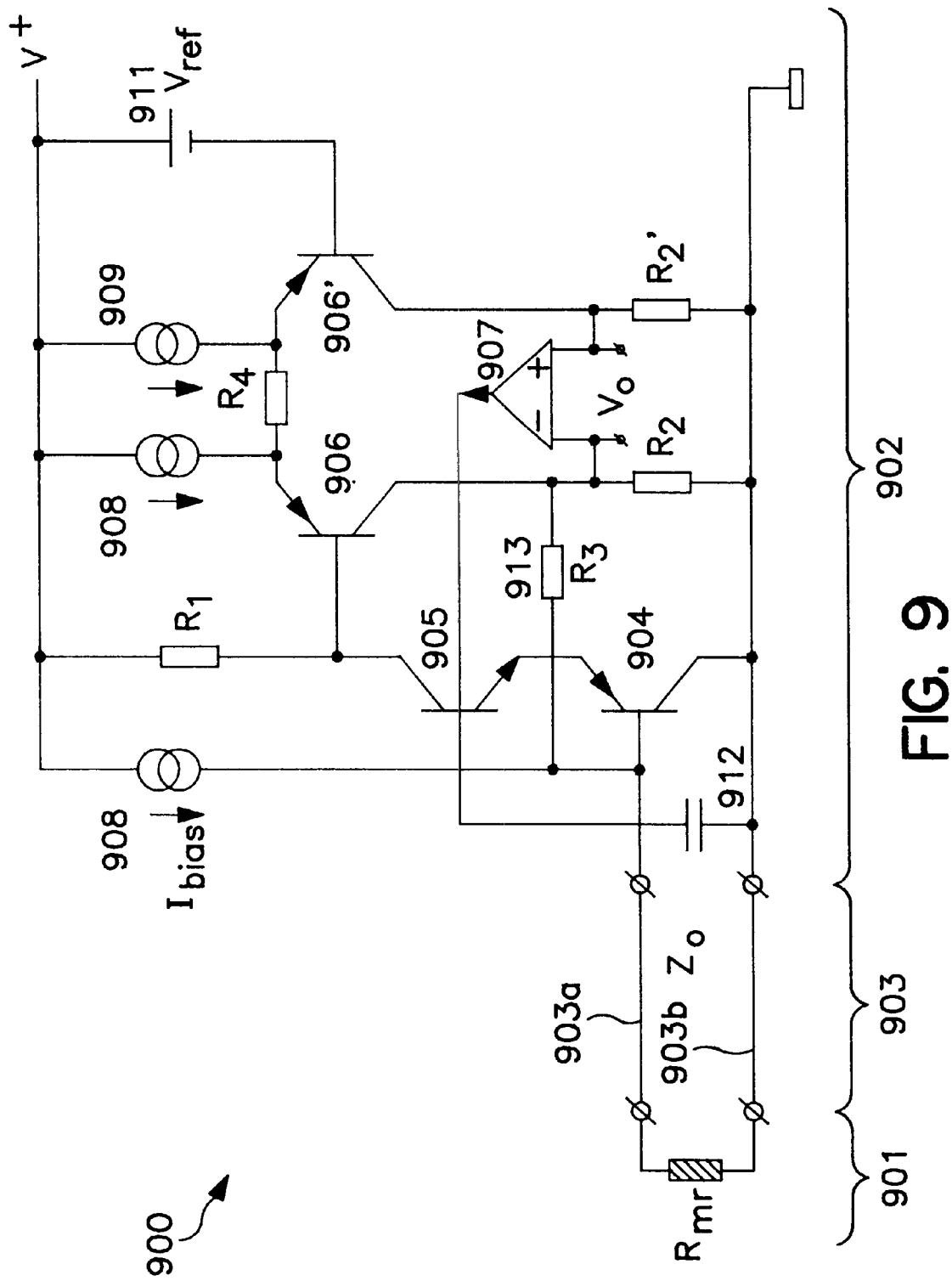
FIG. 9 shows a schematic diagram of an embodiment of a current-biased, voltage-sensing readback amplifier according to the present invention.

FIG. 9 shows a schematic diagram of an embodiment 900 of a current-biased voltage-sensing readback amplifier according to the present invention. In FIG. 9, an MR element $R_{mr}$ that is located in a head 901 is connected to a voltage-sensing readback amplifier 902 through an interconnect 903. Interconnect 903 has a characteristic impedance $Z_0 = R_0$.

Voltage-sensing readback amplifier 902 includes an input pnp transistor 904, an npn transistor 905, pnp transistors 906 and 906', an OTA 907, a resistor $R_1$, resistors $R_2$ and $R'_2$, a feedback resistor $R_3$, and a resistor $R_4$. Conductor 903a of interconnect 903 is connected to the base of transistor 904. Conductor 903b of interconnect 903 is connected to a circuit common, or ground. The emitter of transistor 904 is connected to the emitter of transistor 905, and the collector of transistor 904 is connected to circuit common, or ground. Current source 910 supplies bias current $I_{bias}$ to MR element $R_{mr}$.

The collector of transistor 905 is connected to a power supply voltage $V^+$ through resistor $R_1$ and to the base of transistor 906. A current source 908 is connected to the emitter of transistor 906. The collector of transistor 906 is connected to the inverting input of OTA 907, to the base of transistor 904 through resistor $R_3$ and to circuit common, or ground, through resistor $R_2$. The input impedance $Z_{in}$ is decreased to $Z_{in} \cong Z_0$ by negative feedback being applied to the input of readback amplifier 902 through resistor 913.

A current source 909 is connected to the emitter of a transistor 906'. Resistor $R_4$ is connected between the emitters of transistors 906 and 906'. The base of transistor 906' is connected to power supply voltage $V^+$ through reference voltage source 911. The collector of transistor 906' is connected to the non-inverting input of OTA 907 and to circuit common, or ground, through resistor $R'_2$. The output of OTA 907 is connected to the base of transistor 905 and to capacitor 912. The output $v_o$ of readback amplifier 902 appears between the inverting and non-inverting inputs of OTA 907.

Readback amplifier 902 operates as follows. The current through MR element $R_{mr}$ is equal to the current of current source $I_{bias}$. By choosing $R_2=R'_2$ and $T_3=T'_3$, the low-frequency feedback path formed by OTA 907 and capacitor 912 controls the current through transistors 904 and 905 to be equal to $V_{ref}/R_1$. The emitter differential resistance for transistors 904 and 905 is $r_e=r_{e1}=r_{e2}=R_1 kT/qV_{ref}$. According to Eq. (14), $\alpha$ should be chosen to be $\alpha \cong 2r_e/(R_0-2r_e)$. The feedback resistor $R_3$ should be chosen to be equal to the product of the characteristic impedance $R_0$ and the gain of the stage without the feedback resistor (Eq. (16)). The gain of readback amplifier 902 is given by $R_1 R_2/2r_e R_4$. So, resistor $R_3 \cong R_0 R_1 R_2/2r_e R_4$. The input impedance of the amplifier is now substantially equal to the characteristic impedance $R_0$ of the interconnect.

Figure 10:
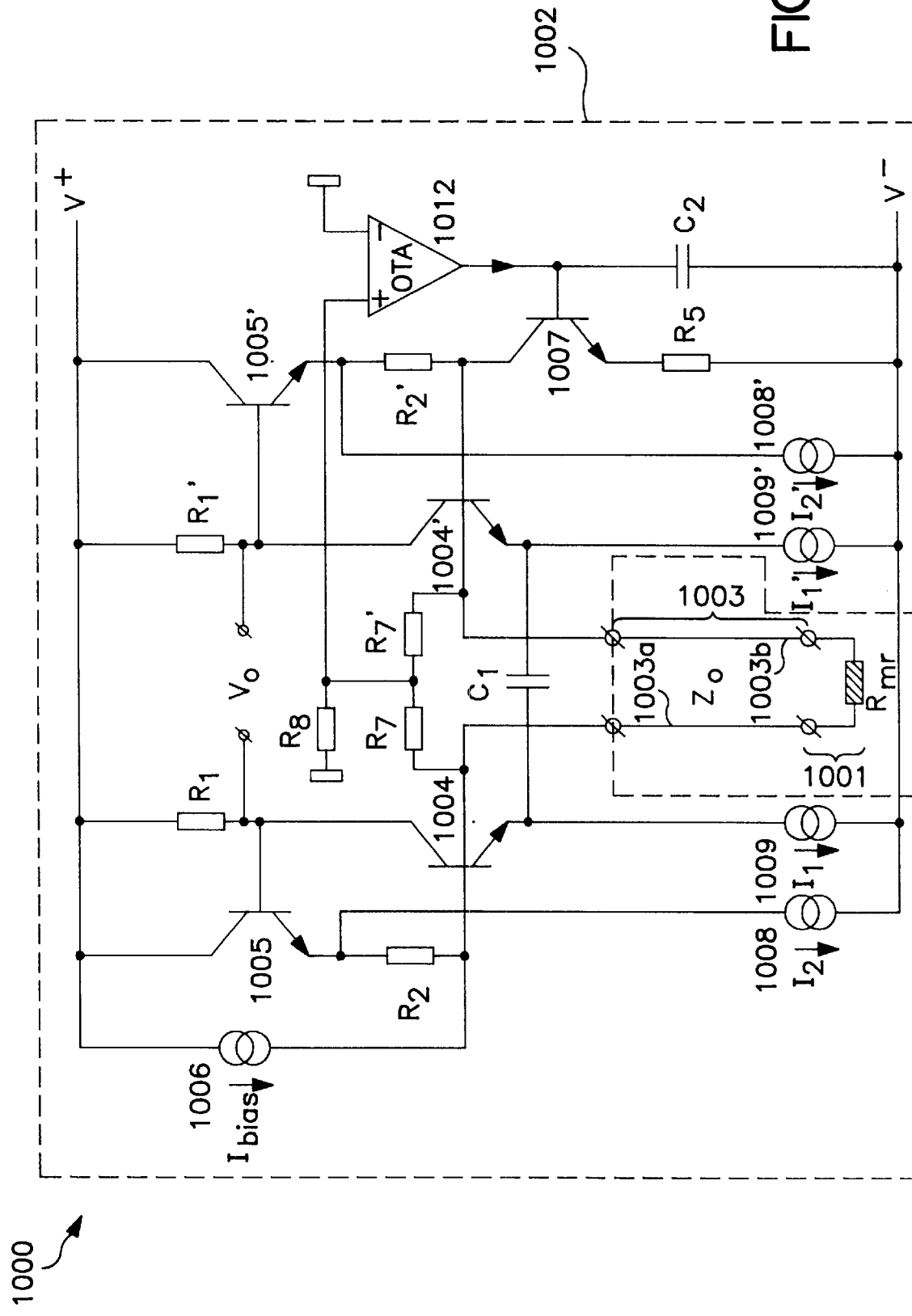
FIG. 10 shows a schematic diagram of an embodiment of a differential current-biased, voltage-sensing readback amplifier according to the present invention.

FIG. 10 shows a schematic diagram of an embodiment 1000 of a differential current-biased, voltage-sensing readback amplifier according to the present invention. Embodiment 1000 is a current-biased, voltage-sensing amplifier like embodiment 900 of FIG. 9, but embodiment 1000 is shown in a differential input configuration. In FIG. 10, an MR element $R_{mr}$ that is located in a head 1001 is connected to a voltage-sensing readback amplifier 1002 through an interconnect 1003. Interconnect has a characteristic impedance $Z_0=R_0$.

Voltage-sensing readback amplifier 1002 includes npn input transistors 1004 and 1004', transistors 1005 and 1005', resistors $R_1$ and $R'_1$, resistors $R_2$ and $R'_2$, and an OTA 1012. Conductor 1003a of interconnect 1003 is connected to the base of transistor 1004. Conductor 1003b of interconnect 1003 is connected to the base of transistor 1004'. The emitters of transistors 1004 and 1004' are respectively connected to a power supply voltage $V^-$ through current sources 1009 and 1009'. A capacitor $C_1$ is connected between the emitters of transistors 1004 and 1004'.

The collectors of transistors 1004 and 1004' are respectively connected to the bases of transistors 1005 and 1005' and to a power supply voltage $V^+$ through resistors $R_1$ and $R'_1$. The output $v_o$ of readback amplifier 1002 appears between the collectors of transistors 1004 and 1004'. The emitters of transistors 1005 and 1005' are respectively connected to the bases of transistors 1004 and 1004' through resistors $R_2$ and $R'_2$. The emitters of transistors 1005 and 1005' are also respectively connected to power supply voltage $V^-$ through current sources 1008 and 1008'.

A current source 1006 is connected to the base of transistor 1004 and supplies bias current $I_{bias}$ to MR element $R_{mr}$. The collector of a transistor 1007 is connected to the base of transistor 1004'. The emitter of transistor 1007 is connected to power supply voltage $V^-$ through resistor $R_5$.

The emitters of transistors 1004 and 1004' are respectively connected through resistors $R_7$ and $R'_7$ to the non-inverting input of OTA 1012. The non-inverting input of OTA 1012 is also connected to circuit common, or ground, through a resistor $R_8$. The inverting input of OTA 1012 is connected to circuit common, or ground. The output of OTA 1012 is connected to the base of transistor 1007. A capacitor $C_2$ is connected between the base of transistor 1007 and power supply voltage $V^-$.

For $R_2 \gg R_{mr}$, the current through MR element $R_{mr}$ is equal to $I_{bias}$. Transistor 1007 and resistor $R_5$ form a controlled current source that is controlled by OTA 1012 so that the center voltage of the MR element is at ground potential. Negative feedback paths are formed by transistor 1005 and resistor $R_2$ and by transistor 1005' and resistor $R'_5$. The gain without these feedback paths is $R_1/r_{e1}$. As a result, feedback resistor $R_2$ ($R'_2$) should be chosen to be $R_2 \cong R_0 R_1/r_{e1}$, with $r_{e1}=kT/qI_1$. In this situation, the input impedance of readback amplifier 1002 is substantially equal to the characteristic impedance $R_0$ of interconnect 1003.

Figure 11:
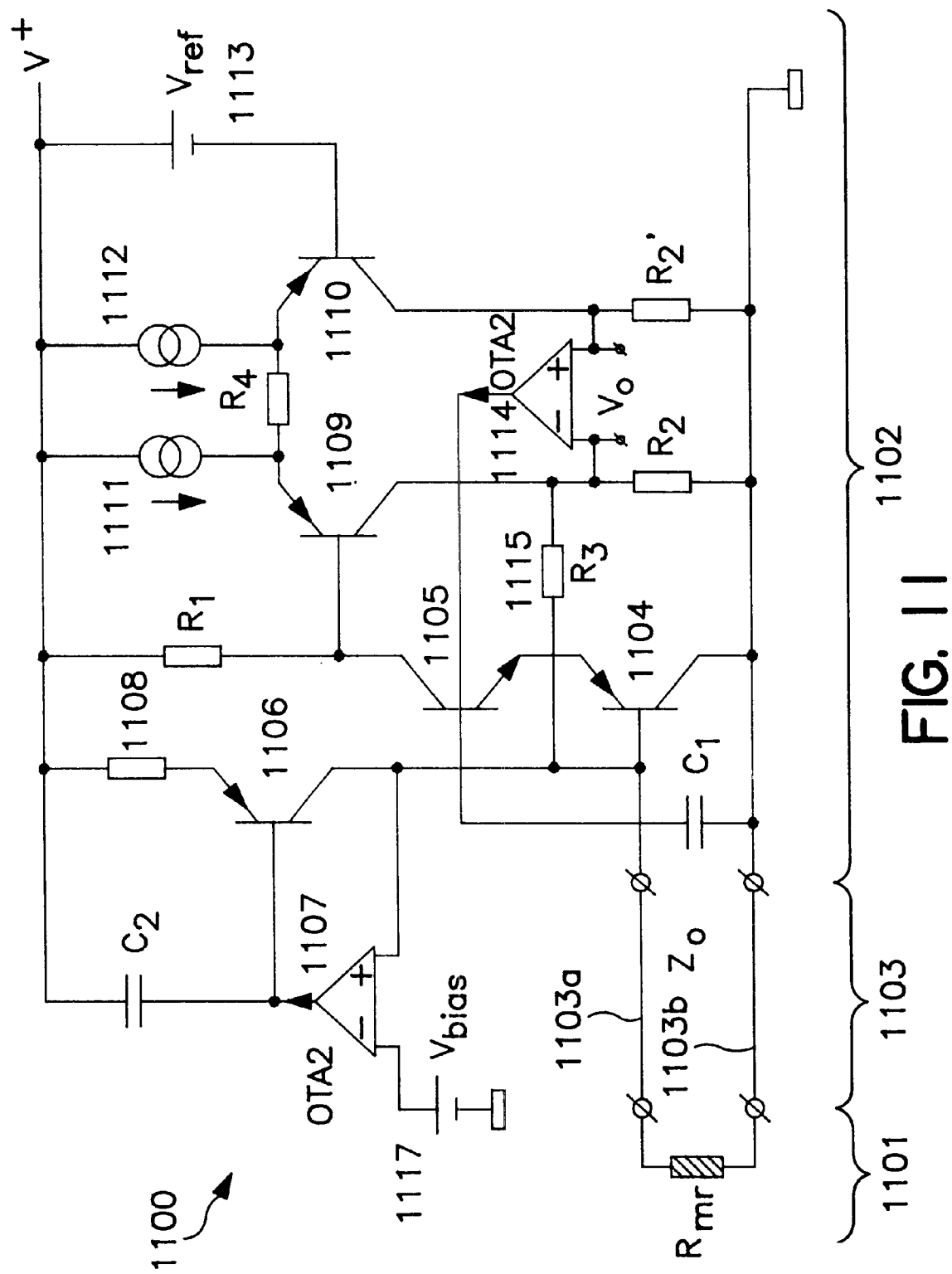
FIG. 11 shows a schematic diagram of an embodiment of a voltage-biased, voltage-sensing readback amplifier according to the present invention.

FIG. 11 shows a schematic diagram of an embodiment 1100 of a voltage-biased, voltage-sensing readback amplifier according to the present invention. In FIG. 11, an MR element $R_{mr}$ that is located in a head 1101 is connected to a voltage-sensing readback amplifier 1102 through an interconnect 1103. Interconnect 1103 has a characteristic impedance $Z_0=R_0$. The input impedance of readback amplifier 1102 is reduced to the level of $Z_{in} \cong R_0$ by negative feedback.

Voltage sensing-readback amplifier 1102 includes a pnp input transistor 1104, a transistor 1105, an OTA 1107, an OTA 1114, a resistor $R_1$, and resistors $R_2$ and $R'_2$. Conductor 1103a of interconnect 1103 is connected to the base of transistor 1104. Conductor 1103b of interconnect 1103 is connected to circuit common, or ground. The emitter of transistor 1104 is connected to the emitter of transistor 1105. The collector of transistor 1105 is connected to a supply voltage $V^+$ through resistor $R_1$, and to the base of a pnp transistor 1109. The collector of transistor 1109 is connected to the base of transistor 1104 through resistor 1115, to circuit common, or ground, through resistor $R_2$, and to the inverting input of OTA 1114.

The emitter of transistor 1109 is connected to power supply voltage $V^+$ through a current source 1111. Similarly, the emitter of a transistor 1110 is connected to power supply voltage $V^+$ through a current source 1112. A resistor $R_4$ is connected between the emitter of transistors 1109 and 1110. The base of transistor 1110 is connected to power supply voltage $V^+$ through a reference voltage source 1113. The collector of transistor 1110 is connected to power supply voltage $V^-$ through resistor $R'_2$ and to the non-inverting input of OTA 1114. The output $v_o$ of readback amplifier 1002 appears between the inverting and non-inverting inputs of OTA 1114. The output of OTA 1114 is connected to the base of transistor 1105 and to capacitor $C_1$.

The base of transistor 1104 is connected to the non-inverting input of OTA 1107 and to the collector of a transistor 1106. The inverting input of OTA 1107 is connected to a reference voltage source 1117 that supplies a voltage $V_{bias}$. The output of OTA 1107 is connected to the base of transistor 1106 and to a capacitor $C_2$. The emitter of transistor 1106 is connected to power supply voltage $V^+$ through a resistor 1108.

For embodiment 1100, the biasing of the MR element is separate from readback amplifier 1102, and readback amplifier 1102 is the same as readback amplifier 902 of FIG. 9, therefore the same expressions hold for readback amplifier 1104 as for readback amplifier 902.

Figure 12:
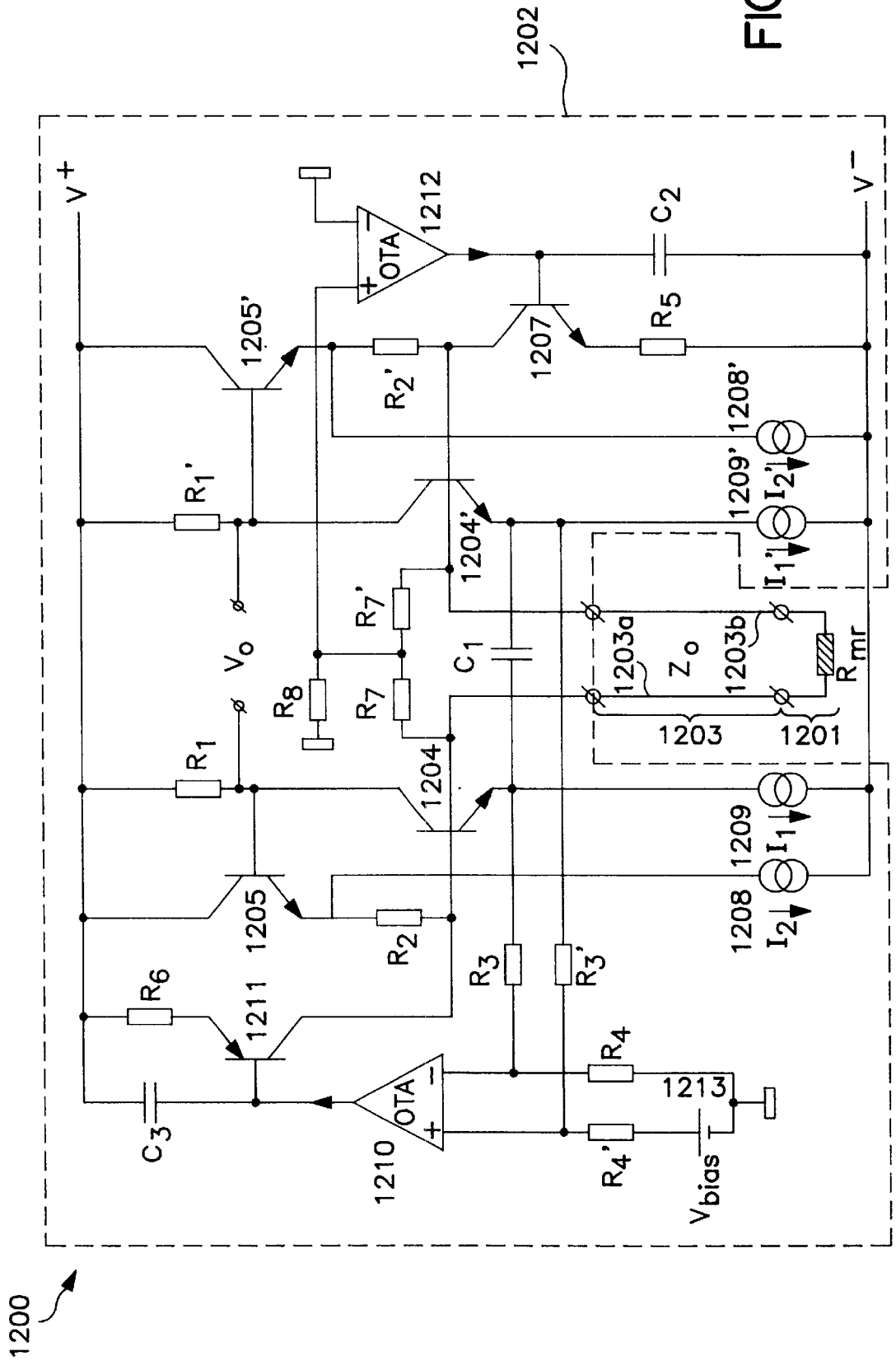
FIG. 12 shows a schematic diagram of an embodiment of a differential voltage-biased, voltage-sensing readback amplifier according to the present invention.

FIG. 12 shows a schematic diagram of an embodiment 1200 of a differential voltage-biased, voltage-sensing readback amplifier according to the present invention. Embodiment 1200 is a voltage-biased, voltage-sensing amplifier like embodiment 1100 of FIG. 11, but embodiment 1200 is shown in a differential input configuration. In FIG. 12, an MR element $R_{mr}$ that is located in a head 1201 is connected to a voltage-sensing readback amplifier 1202 through an interconnect 1203. Interconnect 1203 has a characteristic impedance $Z_0=R_0$. The input impedance of readback amplifier 1202 is reduced to the level of $Z_{in} \cong R_0$ by negative feedback.

Voltage-sensing readback amplifier 1202 includes npn input transistors 1204 and 1204', transistors 1205 and 1205', resistors $R_1$ and $R'_1$, resistors $R_2$ and $R'_2$, and an OTA 1212. Conductor 1203a of interconnect 1203 is connected to the base of transistor 1204. Conductor 1203b of interconnect 1203 is connected to the base of transistor 1204'. The emitters of transistors 1204 and 1204' are respectively connected to a power supply voltage V⁻ through current sources 1209 and 1209'. A capacitor $C_1$ is connected between the emitters of transistors 1204 and 1204'.

The collectors of transistors 1204 and 1204' are respectively connected to the bases of transistors 1205 and 1205' and to a power supply voltage V⁺ through resistors $R_1$ and $R'_1$. The output $v_o$ of voltage-sensing readback amplifier 1202 appears between the collectors of transistors 1204 and 1204'. The emitters of transistors 1205 and 1205' are respectively connected to the bases of transistors 1204 and 1204' through resistors $R_2$ and $R'_2$. The emitters of transistors 1205 and 1205' are also respectively connected to power supply voltage V⁻ through current sources 1208 and 1208'.

The emitters of transistors 1204 and 1204' are respectively connected to the inverting input and the non-inverting input of an OTA 1210 through resistors $R_3$ and $R'_3$. The inverting input of OTA 1210 is also connected to circuit common, or ground, through a resistor $R_4$. The non-inverting input of OTA 1210 is connected to circuit common, or ground, through a resistor $R'_4$ and a reference voltage source 1213, which supplies a reference voltage $V_{bias}$. The output of OTA 1210 is connected to the base of a transistor 1211 and to a capacitor $C_3$. The emitter of transistor 1211 is connected to power supply voltage V⁺ through a resistor $R_6$. The collector of transistor 1211 is connected to the base of transistor 1204.

The emitters of transistors 1204 and 1204' are respectively connected through resistors $R_7$ and $R'_7$ to the non-inverting input of OTA 1212. The non-inverting input of OTA 1212 is also connected to circuit common, or ground, through a resistor $R_8$. The inverting input of OTA 1212 is connected to circuit common, or ground. The output of OTA 1212 is connected to the base of transistor 1207. A capacitor $C_2$ is connected between the base of transistor 1207 and power supply voltage V⁻.

Because the biasing of MR element $R_{mr}$ is separate from voltage-sensing readback amplifier 1202, voltage-sensing readback amplifier 1202 is the same as voltage-sensing readback amplifier 1002 of FIG. 10, and, as a result, the same expressions hold for voltage-sensing readback amplifier 1202.

Figure 13:
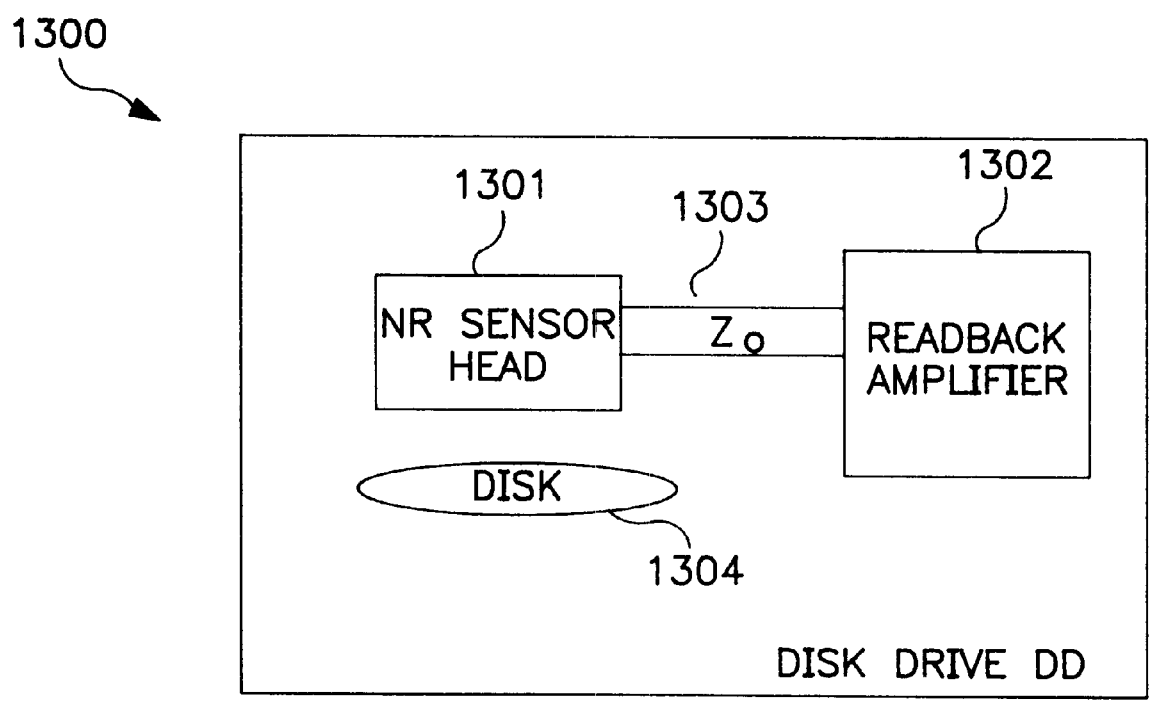
FIG. 13 is a schematic block diagram showing a disk drive system having a magnetic recording channel that incorporates a readback amplifier according to the present invention.

FIG. 13 is a schematic block diagram showing a magnetic storage system 1300 having a magnetic recording channel that incorporates a readback amplifier according to the present invention. Preferably, magnetic storage system 1300 is a disk drive system, but can be any magnetic storage system that utilizes a readback amplifier.

In FIG. 13, disk drive system 1300 includes an MR element $R_{mr}$ that is located in a head 1301. Head 1301 is positioned over a magnetic disk 1304 for reading and writing information to disk 1304 in a well-known manner. Magnetic disk 1304 is a magnetic recording medium that is used for storing information in a well-known manner. Head 1301 is connected to a readback amplifier 1302 through an interconnect 1303. Interconnect 1303 has a characteristic impedance $Z_0=R_0$. According to the present invention, when readback amplifier 1302 is a current-sensing readback amplifier, the input impedance $Z_{in}$ of readback amplifier 1302 is increased to the level of $Z_{in} \cong R_0$ by positive feedback. Likewise, when readback amplifier 1302 is a voltage-sensing readback amplifier, the input impedance of readback amplifier 1302 is reduced to the level of $Z_{in} \cong R_0$ by negative feedback.

While the present invention has been described in connection with the illustrated embodiments, it will be appreciated and understood that modifications may be made without departing from the true spirit and scope of the invention.

What is claimed is:

1. A readback amplifier for a magnetic recording channel front-end, the readback amplifier comprising:

a gain stage having an input that is connectable to an interconnect having a characteristic impedance, the gain stage having an associated impedance and an active termination coupled to the input of the gain stage, an input impedance of the readback amplifier being formed by a combination of the impedance associated with the gain stage and the active termination, the input impedance of the readback amplifier being substantially equal to the characteristic impedance of the interconnect.

2. The readback amplifier according to claim 1, wherein the input impedance of the readback amplifier equals the characteristic impedance of the interconnect.

3. The readback amplifier according to claim 1, wherein the gain stage includes an output, wherein the gain stage generates a first noise signal having a first magnitude appearing at the output of the gain stage, and wherein the active termination generates a second noise signal having a second magnitude appearing at the output of the gain stage, the second magnitude being significantly less that the first magnitude.

4. The readback amplifier according to claim 1, wherein the gain stage is a current-sensing gain stage.

5. The readback amplifier according to claim 4, wherein the active termination provides positive feedback from the gain stage to the input of the gain stage.

6. The readback amplifier according to claim 4, wherein the input of the gain stage is coupled to an emitter of a transistor.

7. The readback amplifier according to claim 1, further comprising the interconnect having the characteristic impedance, the interconnect being coupled to the input of the gain stage.

8. The readback amplifier according to claim 7, further comprising a magnetoresistive element coupled to the gain stage through the interconnect.

9. A magnetic recording channel front-end, comprising:

a magnetoresistive element;

an interconnect coupled to the magnetoresistive element, the interconnect having a characteristic impedance; and a readback amplifier including,
- a gain stage having an input connected to the interconnect, the gain stage having an associated impedance; and
- an active termination coupled to the input of the gain stage, an input impedance of the readback amplifier being formed by a combination of the impedance associated with the gain stage and the active termination, the input impedance of the readback amplifier being substantially equal to the characteristic impedance of the interconnect.

10. The magnetic recording channel front-end according to claim 9, wherein the input impedance of the readback amplifier equals the characteristic impedance of the interconnect.

11. The magnetic recording channel front-end according to claim 9, wherein the gain stage includes an output, wherein the gain stage generates a first noise signal having a first magnitude appearing at the output of the gain stage, and wherein the active termination generates a second noise signal having a second magnitude appearing at the output of the gain stage, the second magnitude being significantly less that the first magnitude.

12. The magnetic recording channel front-end according to claim 9, wherein the gain stage is a current-sensing gain stage.

13. The magnetic recording channel front-end according to claim 12, wherein the active termination provides positive feedback from the gain stage to the input of the gain stage.

14. The magnetic recording channel front-end according to claim 12, wherein the input of the gain stage is coupled to an emitter of a transistor.

* * * * *